(12) United States Patent　　　　(10) Patent No.:　　US 11,972,729 B2
Wu　　　　(45) Date of Patent:　　Apr. 30, 2024

(54) DISPLAY PANEL AND DISPLAY DEVICE ADOPTING A FIRST DOUBLE-GATE STRUCTURE

(71) Applicant: Xiamen Tianma Display Technology Co., Ltd., Xiamen (CN)

(72) Inventor: Jianlong Wu, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/076,907

(22) Filed: Dec. 7, 2022

(65) Prior Publication Data

US 2023/0116711 A1　　Apr. 13, 2023

(30) Foreign Application Priority Data

Jun. 30, 2022　(CN) .......................... 202210770798.2

(51) Int. Cl.
　　*G09G 3/3233*　　(2016.01)
　　*H10K 59/121*　　(2023.01)
　　*G09G 3/36*　　(2006.01)
　　*H01L 29/786*　　(2006.01)

(52) U.S. Cl.
　　CPC ....... *G09G 3/3233* (2013.01); *H10K 59/1213* (2023.02); *G09G 3/36* (2013.01); *G09G 2300/0426* (2013.01); *G09G 2300/0819* (2013.01); *G09G 2300/0842* (2013.01); *G09G 2300/0861* (2013.01); *G09G 2310/0272* (2013.01); *G09G 2330/028* (2013.01); *H01L 29/78648* (2013.01)

(58) Field of Classification Search
　　CPC .................. G09G 3/3233; G09G 3/36; G09G 2300/0426; G09G 2300/0819; G09G 2300/0842; G09G 2300/0861; G09G 2310/0272; G09G 2330/028; H10K 59/1213; H01L 29/78648
See application file for complete search history.

(56) References Cited

U.S. PATENT DOCUMENTS

| | | | |
|---|---|---|---|
| 2015/0009108 A1* | 1/2015 | Song | G09G 3/3225 345/80 |
| 2016/0042806 A1* | 2/2016 | Ogawa | G11C 19/28 377/64 |
| 2020/0135091 A1* | 4/2020 | Kim | G09G 3/32 |
| 2021/0193780 A1* | 6/2021 | Diao | H01L 29/78633 |

FOREIGN PATENT DOCUMENTS

| | | |
|---|---|---|
| CN | 111354322 A | 6/2020 |
| KR | 102343894 B1 | 12/2021 |

\* cited by examiner

*Primary Examiner* — Stephen G Sherman
(74) *Attorney, Agent, or Firm* — KDW Firm PLLC

(57) ABSTRACT

Provided are a display panel and a display device. The pixel display panel includes a pixel driver circuit and the pixel driver circuit includes: a drive module, a first initialization module, a storage module, a threshold compensation module, a data write module and a light-emitting module. At least one of a transistor of the drive module, a transistor of the first initialization module and a transistor of the threshold compensation module adopts a first double-gate structure, the transistor adopting the first double-gate structure includes a control terminal and a first bottom gate electrode, and the first bottom gate electrode is configured to access to a first modulation voltage.

16 Claims, 13 Drawing Sheets

DISPLAY PANEL AND DISPLAY DEVICE ADOPTING A FIRST DOUBLE-GATE STRUCTURE

CROSS-REFERENCE TO RELATED APPLICATION

This application claims priority to Chinese Patent Application No. 202210770798.2 filed Jun. 30, 2022, the disclosure of which is incorporated herein by reference in its entirety.

TECHNICAL FIELD

The present disclosure relates to the field of display technologies and, in particular, to a display panel and a display device.

BACKGROUND

Thin-film transistors (TFT) are widely used as switch elements in display panels (such as liquid crystal panels or organic light-emitting display panels). Therefore, array substrates formed with thin-film transistors are essential elements of display panels constructed for display devices.

However, in display driver circuits of array substrates, the hysteresis phenomenon of thin-film transistors exists, which seriously affects the display effect of display devices.

SUMMARY

Embodiments of the present disclosure provide a display panel and a display device.

In a first aspect, the embodiments of the present disclosure provide a display panel including a pixel driver circuit. The pixel driver circuit includes a drive module, a first initialization module, a storage module, a threshold compensation module, a data write module and a light-emitting module.

A first terminal of the drive module is configured to receive a signal provided by a first power supply, a second terminal of the drive module is configured to provide a light emission drive signal for the light-emitting module, the storage module is connected between a control terminal of the drive module and the first terminal of the drive module, and the threshold compensation module is connected between the control terminal of the drive module and the second terminal of the drive module.

The data write module is connected to the first terminal of the drive module for transmitting a data voltage to the drive module, and the first initialization module is connected between a first reference voltage output terminal and the control terminal of the drive module for providing a first initialization voltage for the drive module.

At least one of a transistor of the drive module, a transistor of the first initialization module and a transistor of the threshold compensation module adopts a first double-gate structure, a transistor adopting the first double-gate structure includes a control terminal and a first bottom gate electrode, and the first bottom gate electrode is configured to access to a first modulation voltage.

In a second aspect, the embodiments of the present disclosure further provide a display device including the display panel of the first aspect.

DETAILED DESCRIPTION

Figure 1:
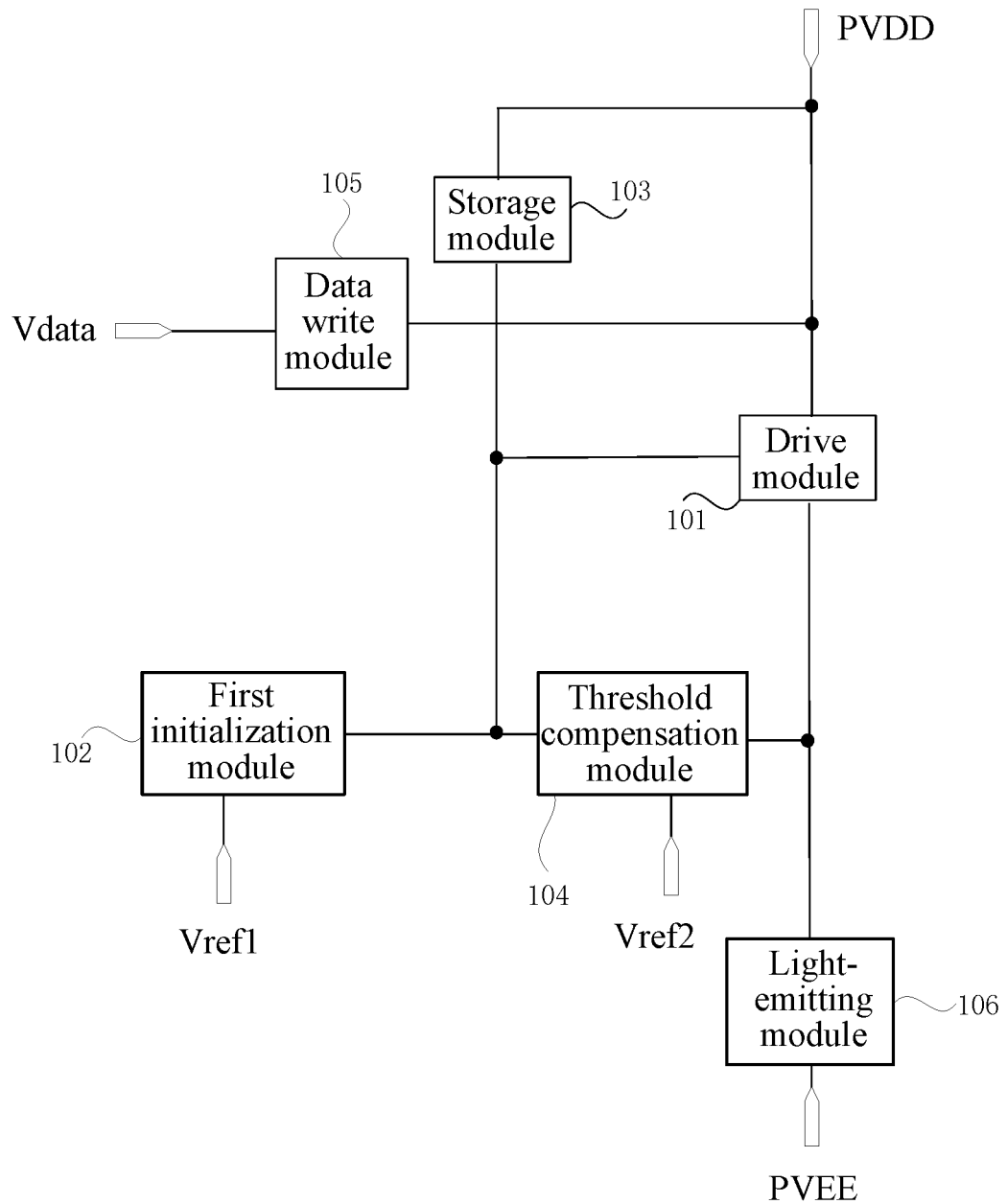
FIG. 1 is a structural diagram of a pixel driver circuit according to an embodiment of the present disclosure.

Hereinafter the present disclosure is further described in detail in conjunction with the drawings and embodiments. It is to be understood that the specific embodiments set forth below are intended to illustrate and not to limit the present disclosure. Additionally, it is to be noted that, for ease of description, only part, not all, of structures related to the present disclosure are illustrated in the drawings.

In the related art, with regard to a conventional pixel driver circuit, such as a 7T1C circuit, the transistor in the pixel driver circuit is generally a single-gate p-type transistor or a single-gate n-type transistor. When the transistor is turned on at different stages, the transistor is prone to have a hysteresis problem, seriously affecting the display effect of the display panel.

In the embodiments of the present disclosure, a display panel and a display device are provided. The display panel includes a pixel driver circuit and the pixel driver circuit includes a drive module, a first initialization module, a storage module, a threshold compensation module, a data write module and a light-emitting module. A first terminal of the drive module is configured to receive a signal provided by a first power supply, a second terminal of the drive module is configured to provide a light emission drive signal for the light-emitting module, the storage module is connected between a control terminal of the drive module and the first terminal of the drive module, and the threshold compensation module is connected between the control terminal of the drive module and the second terminal of the drive module; the data write module is connected to the first terminal of the drive module for transmitting a data voltage to the drive module, and the first initialization module is connected between a first reference voltage output terminal and the control terminal of the drive module for providing a first initialization voltage for the drive module; and at least one of a transistor of the drive module, a transistor of the first initialization module and a transistor of the threshold compensation module adopts a first double-gate structure, the transistor adopting the first double-gate structure includes a control terminal and a first bottom gate electrode, and the first bottom gate electrode is configured to access to a first modulation voltage. At least one of the transistors of the drive module, the first initialization module and the threshold compensation module in the pixel driver circuit adopts the first double-gate structure, and a first bottom gate electrode of the first double-gate structure accesses to the first modulation voltage to modulate the threshold voltage of the transistor with the first double-gate structure, so that the hysteresis phenomenon of the transistor is improved, the phenomena of smear, image retention and uneven display of the display panel are improved, and the normal display of the display panel is ensured. Moreover, the first bottom gate electrode can serve to shield from light to a certain extent, and thus can slow down the degradation of the transistor device in a blue light illumination reliability test. For example, in reliability tests related to positive bias illumination, negative bias illumination and the like, the first bottom gate electrode can effectively slow down the degradation of the transistor and improve the reliability of the display panel.

The above is the core concept of the present disclosure, and the technical solutions in the embodiments of the present disclosure are described clearly and completely hereinafter in conjunction with the drawings in the embodiments of the present disclosure. Based on the embodiments of the present disclosure, all other embodiments obtained by those of ordinary skill in the art without creative work are within the protection scope of the present disclosure.

Figure 2:
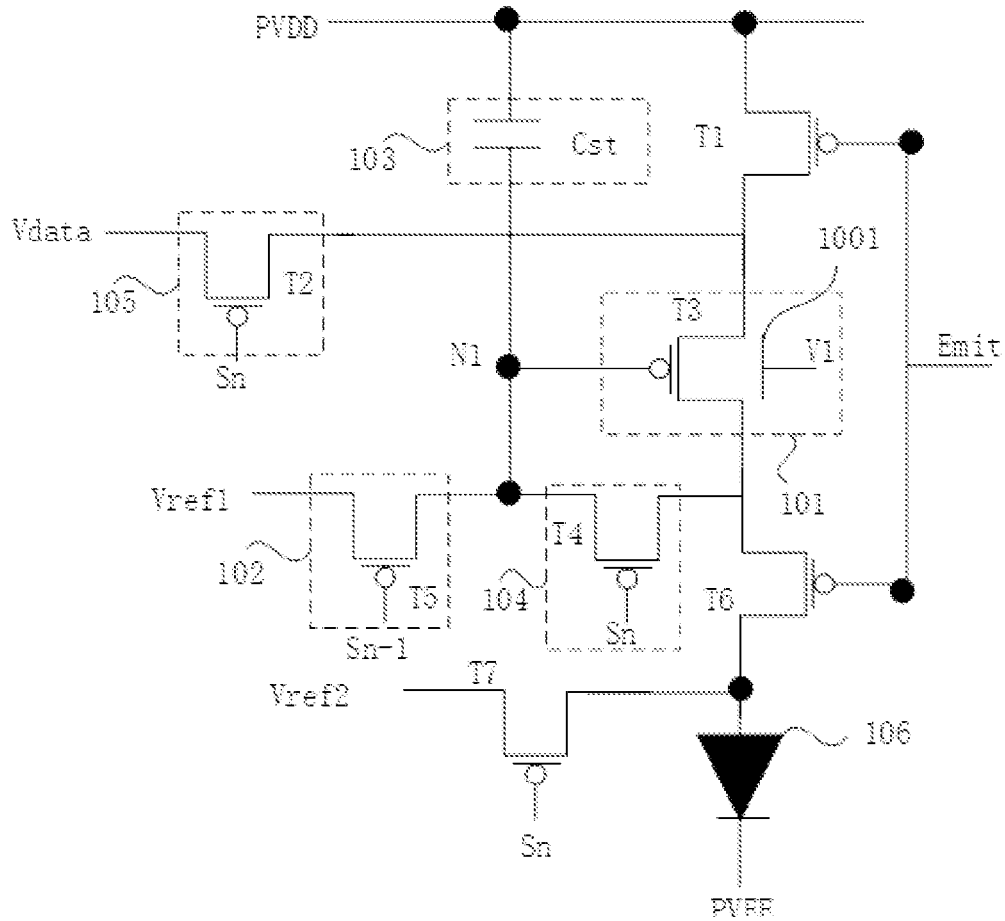
FIG. 2 is a structural diagram of another pixel driver circuit according to an embodiment of the present disclosure.

FIG. 1 is a structural diagram of a pixel driver circuit according to an embodiment of the present disclosure, and FIG. 2 is a structural diagram of another pixel driver circuit according to an embodiment of the present disclosure. As shown in FIG. 1 and FIG. 2, the pixel driver circuit includes a drive module 101, a first initialization module 102, a storage module 103, a threshold compensation module 104, a data write module 105 and a light-emitting module 106. A first terminal of the drive module 101 is configured to receive a signal provided by a first power supply, a second terminal of the drive module 101 is configured to provide a light emission drive signal for the light-emitting module 106, the storage module 103 is connected between a control terminal of the drive module 101 and the first terminal of the drive module 101, and the threshold compensation module 104 is connected between the control terminal of the drive module 101 and the second terminal of the drive module 101; the data write module 105 is connected to the first terminal of the drive module 101 for transmitting a data voltage to the drive module 101, and the first initialization module 102 is connected between a first reference voltage output terminal and the control terminal of the drive module 101 for providing a first initialization voltage for the drive module 101; and at least one of a transistor of the drive module 101, a transistor of the first initialization module 102 and a transistor of the threshold compensation module 401 adopts a first double-gate structure, the transistor adopting the first double-gate structure includes a control terminal and a first bottom gate electrode 1001, and the first bottom gate electrode 1001 is configured to access to a first modulation voltage V1.

Figure 3:
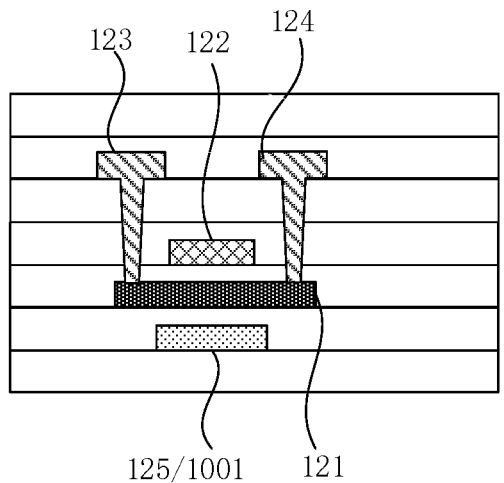
FIG. 3 is a sectional view of a transistor with a first double-gate structure.

The light-emitting module 106 may be, for example, an organic light-emitting diode (OLED). The OLED is a current-mode device, which can emit light only under the action of a drive current. The drive module 101 may generate a corresponding drive current according to a data voltage signal to drive the light-emitting module 106 to display different grayscales, so that the display panel can display a to-be-displayed image. The specific working process of the pixel driver circuit includes an initialization stage, a data write stage and a light emission stage. The initialization stage includes a first initialization stage. The first initialization module 102 is connected to the control terminal of the drive module 101. In the first initialization stage, the first initialization module 102 is turned on, and the first initialization module 102 transmits the first initialization voltage Vref1 output by the first reference voltage output terminal to the control terminal of the drive module 101 for initialization, so that residual charges of the previous frame of image can be cleared to improve the display effect of the display panel. In the data write stage, the first initialization module 102 is turned off, the data write module 105 and the threshold compensation module 104 are turned on, the data write module 105 is connected to the first terminal of the drive module 101 and the data write module 105 writes the data voltage signal Vdata into the drive module 101, the threshold compensation module 104 is connected between the control terminal of the drive module 101 and the second terminal of the drive module 101, where the threshold compensation module 104 is capable of grabbing the threshold voltage of the drive module 101 to the control terminal of the drive module 101 to achieve the compensation of the threshold voltage, and the storage module 103 is connected between the control terminal of the drive module 101 and the first terminal of the drive module 101, where the storage module 103 is capable of maintaining the potential at the control terminal of the drive module 101 to prevent the potential at the control terminal of the drive module 101 from being coupled to change when the first initialization module 102 is turned off. In the light emission stage, the first initialization module 102, the data write module 105 and the threshold compensation module 104 are all turned off, the drive module 101 is turned on, the second terminal of the drive module 101 is connected to a light-emitting element for providing a light emission drive current for the light-emitting module 106, and the light-emitting module 106 emits light in response to the light emission drive current, so as to display the to-be-displayed luminance. In the related art, the drive module 101, the first initialization module 102 and the threshold compensation module 104 are conventional single-gate p-type transistors, so that the hysteresis phenomenon exists during use, thereby affecting the display effect of the display panel. To avoid this, at least one of the transistors of the drive module 101, the first initialization module 102 and the threshold compensation module 104 adopts the first double-gate structure. Exemplarily, FIG. 2 shows the example in which transistors of the drive module 101 are all first double-gate structures. FIG. 3 is a sectional view of a transistor with the first double-gate structure. As shown in FIG. 3, the transistor with the first double-gate structure includes a control terminal and a first bottom gate electrode 1001, and the transistor with the first double-gate structure includes a semiconductor layer 121, a first gate 122, a source 123, a drain 124 and a second gate 125, that is, the second gate is the first bottom gate electrode 1001. The first bottom gate electrode 1001 can serve to shield from light, improve the hysteresis phenomenon of the transistor, and further improve the phenomena of smear, image retention and uneven display of the display panel, so as to ensure the normal display of the display panel. The first bottom gate electrode 1001 accesses to the first modulation voltage V1, and the first modulation voltage V1 may be separately set or may be an existing signal in the pixel driver circuit. For example, the first modulation voltage V1 may adopt a first power supply signal PVDD output by the first power supply, may be a high voltage signal VGH of a gate driver circuit, and in addition, may also be a second power supply signal PVEE output by a second power supply connected to the light-emitting module, a low voltage signal VGL of the gate driver circuit or a first reference voltage VREF1 output by the first reference voltage output terminal.

In addition, the first modulation voltage V1 may also adjust the threshold voltage of the first gate 122 (the control terminal), specifically, so that the first bottom gate electrode 1001 accesses to the first modulation voltage V1, affecting the width of a conductive channel in a semiconductor layer in the transistor, thereby affecting the threshold voltage of the transistor. The first modulation voltage V1 may be a fixed voltage signal. The first modulation voltage V1 may be a positive voltage signal or a negative voltage signal, and when the threshold voltage of the transistor needs to be adjusted, a specific voltage value of the first modulation voltage V1 may be set. For example, for the p-type transistor, when the first modulation voltage V1 accessed by the first bottom gate electrode 1001 is PVDD, for example, is 6V, the first bottom gate electrode 1001 forms a positive electric field, making the channel of the transistor difficult to turn on and resulting in a negative bias of the threshold voltage; and when the value of the first modulation voltage V1 accessing to first bottom gate electrode 1001 is relatively small, for example, the value is a negative value, the first bottom gate electrode 1001 forms a negative electric field, making the channel of the transistor easy to turn on and resulting in a positive bias of the threshold voltage.

In an embodiment, the first modulation voltage V1 is less than or equal to 3V.

When the first modulation voltage V1 is less than or equal to 3V, generally, the first modulation voltage V1 is not negatively biased, and the transistors in key modules in the pixel driver circuit, for example, the transistors in the drive module 101, the first initialization module 102 and the threshold compensation module 104, are key transistors. To avoid the difficulty of turning on the key transistors and the resulting increased low voltage signal VGL of the gate driver circuit and the increased overall consumption, the transistors of the preceding modules may be controlled to be not in the negative bias state in the embodiment, so that it is easy to turn on the key transistors. In the process of turning on the transistor, the first modulation voltage V1 serves to reduce the threshold voltage deviation caused by applying a voltage for a long time on the control terminal of the transistor; the first bottom gate electrode 1001 in the transistor with the first double-gate structure accesses to the first modulation voltage V1 which is less than or equal to 3V, so as to avoid the negative bias of the threshold voltage in the transistor, ensure the normal turning-on of the transistor, and thus effectively achieve the driving process of the pixel driver circuit.

In an embodiment, the first modulation voltage V1 is less than or equal to 0V. To further accelerate the turning-on of the transistor, the positive bias of the transistor may be effectively controlled in the embodiment. Specifically, the first bottom gate electrode 1001 in the transistor with the first double-gate structure accesses to the first modulation voltage V1 which is less than or equal to 0V, so that the positive bias occurs on the threshold voltage of the transistor, the difficulty of turning on the transistor is reduced, the time for turning on the transistor is shortened, the speed of the pixel drive circuit is increased, and thus the display effect of the display panel is ensured.

In the embodiment of the present disclosure, at least one of the transistors of the drive module, the first initialization module and the threshold compensation module in the pixel driver circuit adopts the first double-gate structure, and the first bottom gate electrode of the first double-gate structure accesses to the first modulation voltage to modulate the threshold voltage of the transistor with the first double-gate structure, so that the negative bias phenomenon and the hysteresis phenomenon of the transistor are improved, the phenomena of smear, image retention and uneven display of the display panel are improved, and the normal display of the display panel is ensured.

Figure 4:
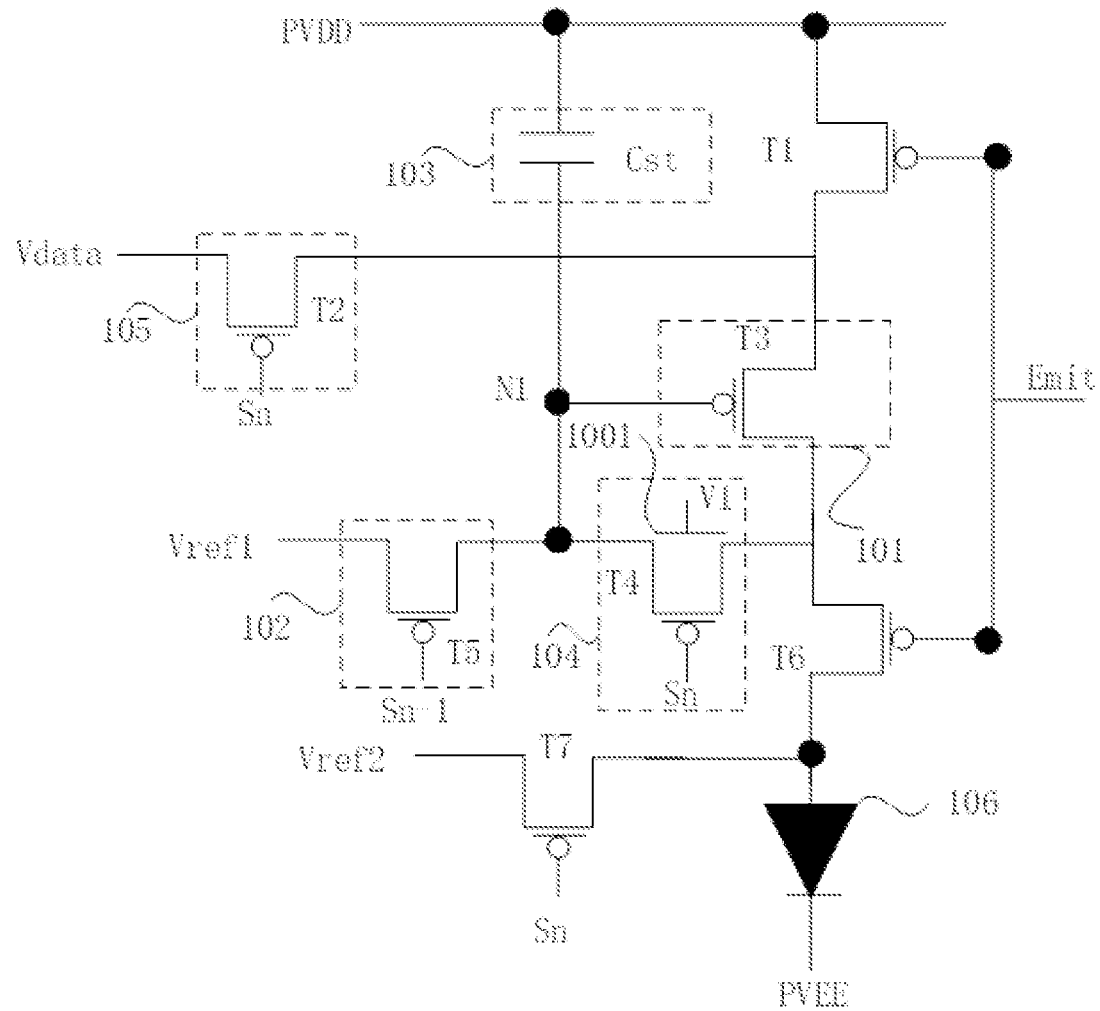
FIG. 4 is a structural diagram of another pixel driver circuit according to an embodiment of the present disclosure.

Optionally, FIG. 4 is a structural diagram of another pixel driver circuit according to an embodiment of the present disclosure. As shown in FIG. 4, the transistor of the threshold compensation module 104 adopts the first double-gate structure.

The transistor in the threshold compensation module 104 may adopt the first double-gate structure, and the first bottom gate electrode 1001 is configured to access to the first modulation voltage V1; when the negative bias occurs on the transistor in the threshold compensation module 104, the threshold voltage of the transistor is pulled back to a normal threshold voltage, so as to avoid the difficulty of turning on the transistor under the negative bias of the threshold voltage and the requirement for a smaller low-level signal to enable a voltage signal to be successfully written into the transistor in the threshold compensation module 104, and thus the power consumption of the pixel driver circuit is effectively reduced.

Figure 5:
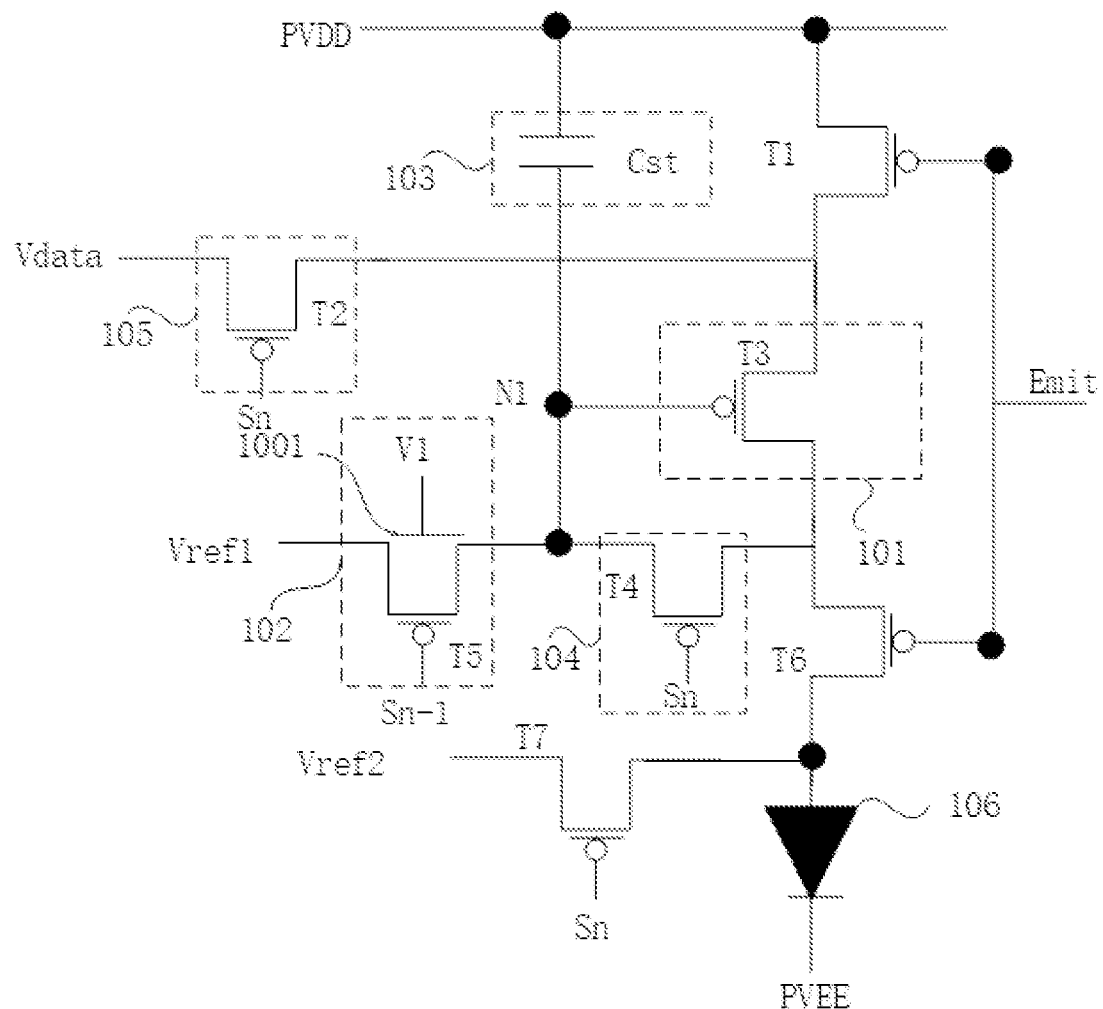
FIG. 5 is a structural diagram of another pixel driver circuit according to an embodiment of the present disclosure.

Optionally, FIG. 5 is a structural diagram of another pixel driver circuit according to an embodiment of the present disclosure. As shown in FIG. 5, the transistor of the first initialization module 102 adopts the first double-gate structure.

When the transistor in the first initialization module 102 is in a turned-on state, a gate-source voltage difference is relatively small; if the threshold voltage is negatively biased, the first initialization module 102 is difficult to turn on, and thus it is difficult to ensure the initialization reset of the control terminal of the drive module 101. To avoid this, the transistor in the first initialization module 102 may adopt the first double-gate structure, thus when the negative bias occurs on the transistor in the first initialization module 102, the threshold voltage of the transistor is pulled back to a normal threshold voltage, so as to avoid the difficulty of turning on the transistor in the first initialization module 102 under the negative bias of the threshold voltage and the requirement for a low-level signal having a larger absolute value to enable the first initialization voltage Vref1 to be successfully written into the transistor in the threshold compensation module 104, and thus the power consumption of the pixel driver circuit is effectively reduced. In addition, the residual charges of the previous frame of image of the drive module 101 can be cleared in time, so as to ensure the display effect and avoid the problems of smear, image retention and uneven display.

Figure 6:
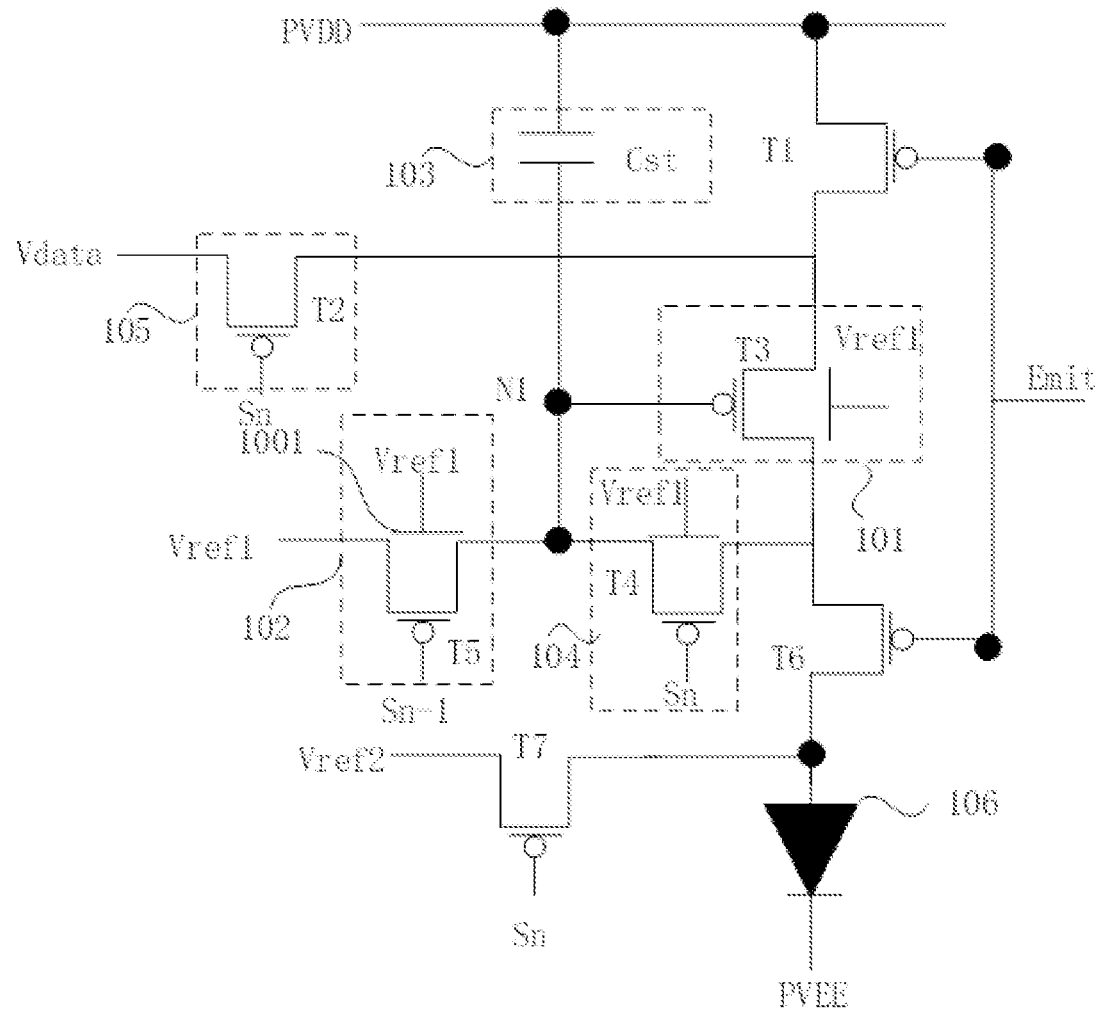
FIG. 6 is a structural diagram of another pixel driver circuit according to an embodiment of the present disclosure.

Optionally, FIG. 6 is a structural diagram of another pixel driver circuit according to an embodiment of the present disclosure. As shown in FIG. 6, the first initialization voltage Vref1 is also served as the first modulation voltage V1.

As shown in FIG. 6, the transistors of the drive module 101, the first initialization module 102 and the threshold compensation module 104 all adopt the first double-gate structure, and the first initialization voltage Vref1 of the pixel driver circuit is also served as the first modulation voltage V1, so as to avoid additional signal lines, reduce the number of signal lines and reduce the process difficulty. At the same time, the first initialization voltage Vref1 is at a low level, so that the threshold voltage of the transistors with the first double-gate structure in the drive module 101, the first initialization module 102 or the threshold compensation module 104 is not negatively biased, thus the difficulty of turning on the transistor is reduced, the power consumption of the pixel driver circuit is reduced, and the service life is improved. In addition, other negative-value signals such as the low voltage signal VGL of the gate driver circuit may be set as the first modulation voltage V1, which is not particularly limited in the embodiment. Exemplarily, when the threshold voltage of the transistor is negatively biased, the threshold voltage of −8V is negatively biased to the threshold voltage of −9V; at this time, the first modulation voltage V1 is a fixed voltage less than 0V, and the threshold voltage is pulled negative to −7V, that is, is corrected to a threshold voltage having a relatively small absolute value, so that the difficulty of turning on the transistor is avoided.

Figure 7:
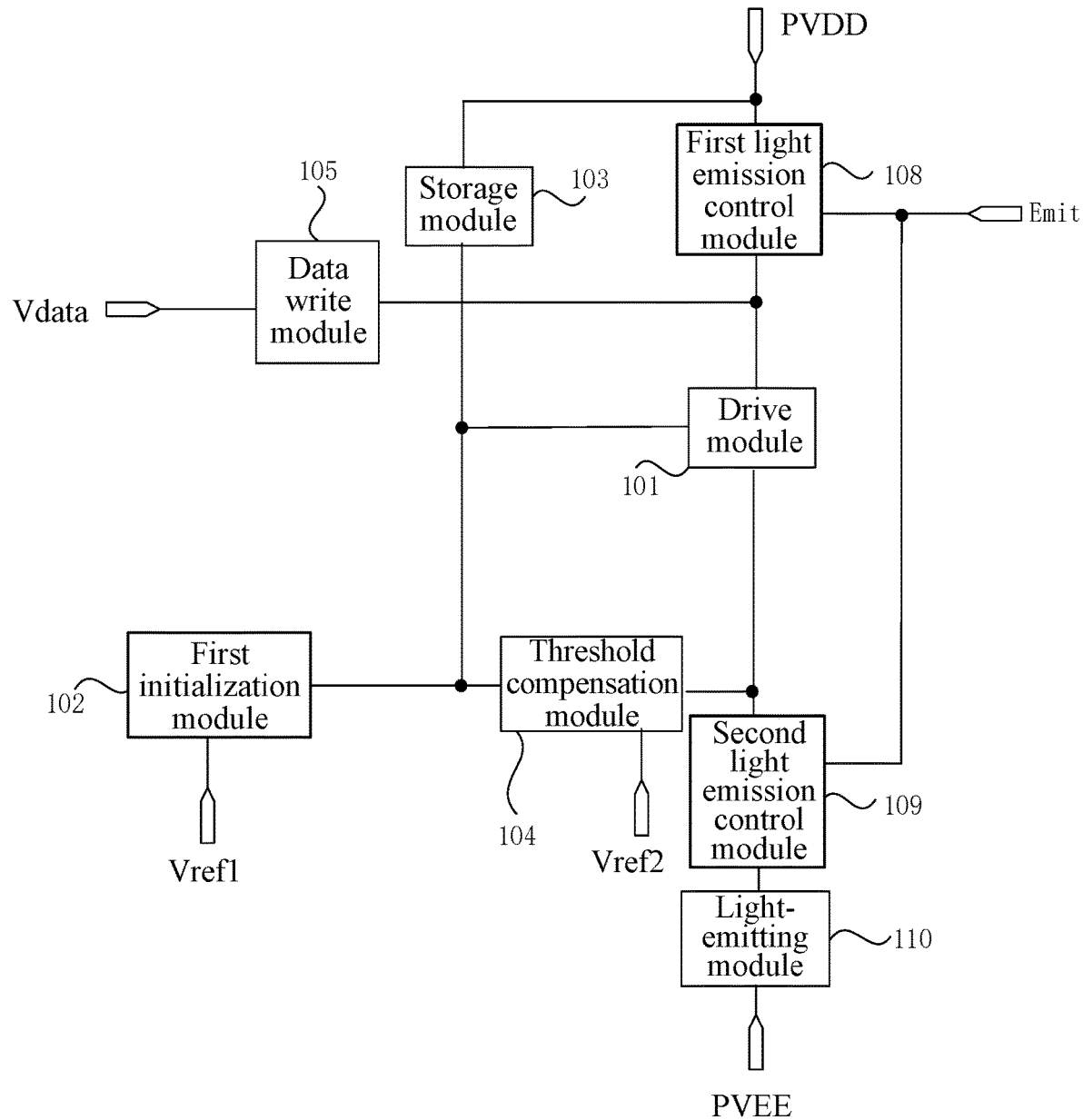
FIG. 7 is a structural diagram of another pixel driver circuit according to an embodiment of the present disclosure.

Optionally, FIG. 7 is a structural diagram of another pixel driver circuit according to an embodiment of the present disclosure. As shown in FIG. 7, the pixel driver circuit further includes a second initialization module 107, where the second initialization module 107 is connected between a second reference voltage output terminal VREF2 and a first terminal of the light-emitting module 106 for providing a second initialization voltage Vref2 for the light-emitting module 106.

The pixel driver circuit further includes the second initialization module 107, and the second initialization module 107 is connected between the second reference voltage output terminal VRED2 and the first terminal of the light-emitting module 106 for providing the second initialization voltage Vref2 for the light-emitting module 106; in this manner, the residual charges of the previous frame of image can be cleared, so that the light-emitting module 106 can display the to-be-displayed luminance more accurately, and the image quality of the display panel can be improved. A control terminal of the second initialization module 107 may access to a first scan signal line or a second scan signal line, so that the second initialization module 107 can initialize the light-emitting module 106 in the first initialization stage or the data write stage; in this manner, the number of signal lines can be reduced, the manufacturing cost can be reduced, and the complexity of the pixel driver circuit can be simplified.

Figure 8:
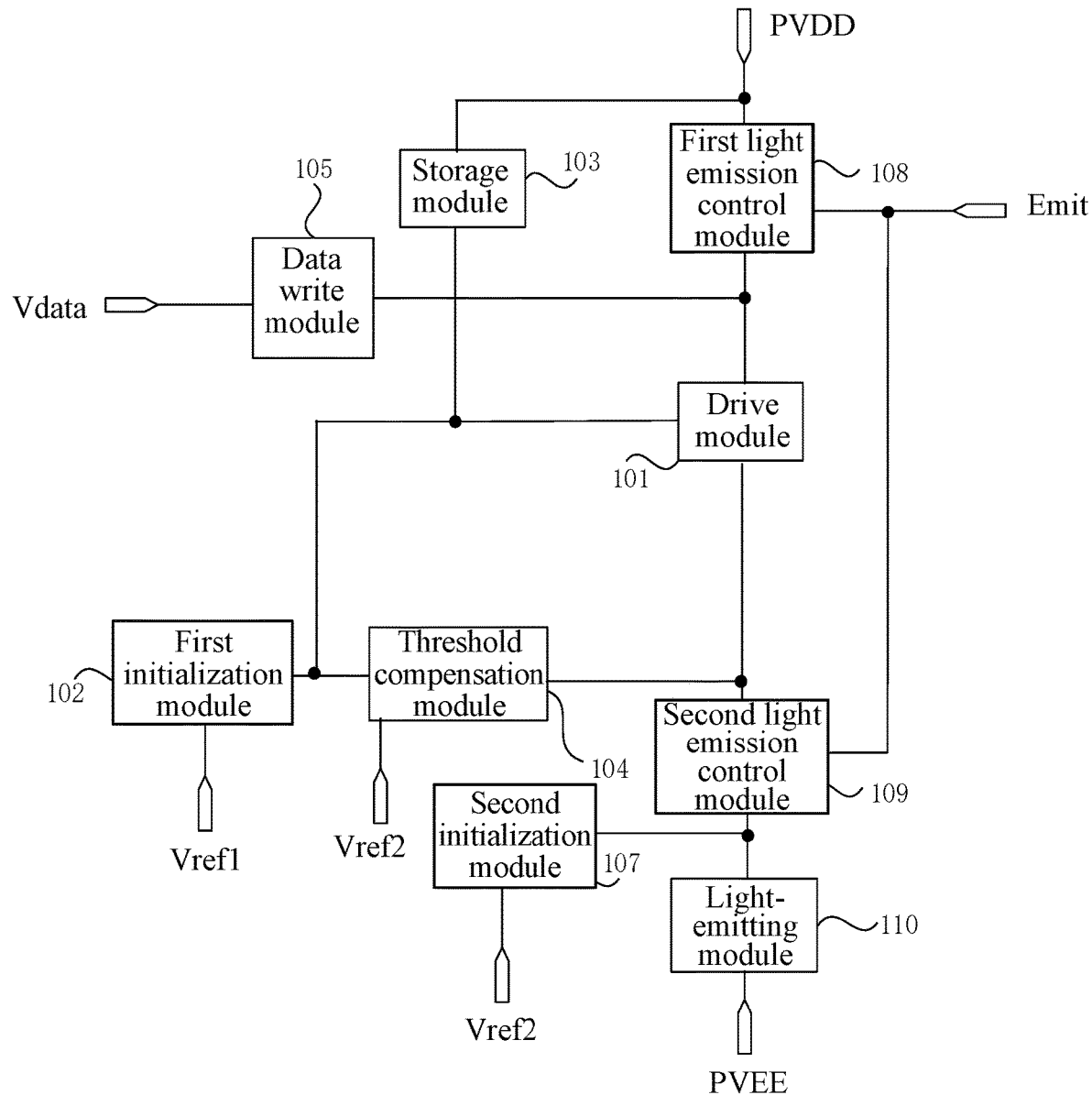
FIG. 8 is a structural diagram of another pixel driver circuit according to an embodiment of the present disclosure.

Optionally, FIG. 8 is a structural diagram of another pixel driver circuit according to an embodiment of the present disclosure. As shown in FIG. 8, the pixel driver circuit further includes a first light emission control module 108 and a second light emission control module 109. The first light emission control module 108 is connected between the first power supply PVDD and the first terminal of the drive module 101, the second light emission control module 109 is connected between the second terminal of the drive module 101 and the first terminal of the light-emitting module 106, and a second terminal of the light-emitting module 106 is connected to the second power supply PVEE.

The pixel driver circuit further includes the first light emission control module 108 and the second light emission control module 109. The first light emission control module 108 is connected between the first power supply PVDD and the first terminal of the drive module 101, the second light emission control module 109 is connected between the second terminal of the drive module 101 and the first terminal of the light-emitting module 106, and the second terminal of the light-emitting module 106 is connected to the second power supply PVEE. In the light emission stage, the first light emission control module 108 and the second light emission control module 109 are turned on, thus a voltage difference is generated between the first terminal of the drive module 101 and the second terminal of the drive module 101 and then a light emission drive signal is output to the first terminal of the light-emitting module 106; the second terminal of the light-emitting module 106 is connected to the second power supply PVEE, so that a path is formed between the first power supply PVDD, the first light emission control module 108, the drive module 101, the second light emission control module 109, the light-emitting module 106 and the second power supply PVEE, and the light-emitting module 106 emits light so as to display the to-be-displayed luminance.

Figure 9:
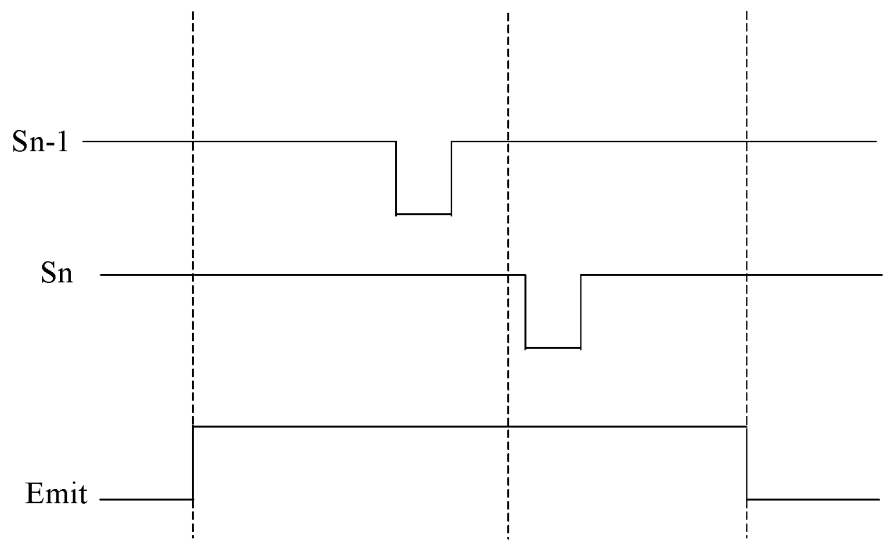
FIG. 9 is a timing diagram of a pixel driver circuit according to an embodiment of the present disclosure.

Optionally, FIG. 9 is a timing diagram of a pixel driver circuit according to an embodiment of the present disclosure. As shown in FIG. 6 and FIG. 9, the storage module 103 includes a first capacitor Cst, the first light emission control module 108 includes a first transistor T1, the data write module 105 includes a second transistor T2, the drive module 101 includes a third transistor T3, the threshold compensation module 104 includes a fourth transistor T4, the first initialization module 102 includes a fifth transistor T5, the second light emission control module 109 includes a sixth transistor T6, and the second initialization module 107 includes a seventh transistor T7. A control terminal of the third transistor T3 is separately connected to a second terminal of the fifth transistor T5 and a first terminal of the fourth transistor T4, a first terminal of the third transistor T3 is connected to a second terminal of the first transistor T1, a first terminal of the first transistor T1 is connected to the first power supply PVDD, a second terminal of the third transistor T3 is separately connected to a second terminal of the fourth transistor T4 and a first terminal of the sixth transistor T6, and a second terminal of the sixth transistor T6 is connected to the first terminal of the light-emitting module 106. A first terminal of the fifth transistor T5 is connected to the first reference voltage output terminal VREF1, a first terminal of the second transistor T2 is connected to a data signal line DATA, a second terminal of the second transistor T2 is connected to the first terminal of the third transistor T3, a first terminal of the seventh transistor T7 is connected to the second reference voltage output terminal VREF2, and a second terminal of the seventh transistor T7 is connected to the first terminal of the light-emitting module 106. At least one of the third transistor T3, the fourth transistor T4 and the fifth transistor T5 adopts the first double-gate structure, a control terminal of the first transistor T1 and a control terminal of the sixth transistor T6 are connected to a light emission control signal line EM, a control terminal of the fifth transistor T5 is connected to the first scan signal line, a control terminal of the fourth transistor T4, a control terminal of the second transistor T2 and a control terminal of the seventh transistor T7 are connected to the second scan signal line.

The first transistor T1, the second transistor T2, the third transistor T3, the fourth transistor T4, the fifth transistor T5, the sixth transistor T6 and the seventh transistor are all p-type transistors, and the p-type transistors are turned on at a low level and turned off at a high level. Exemplarily, the working principle of the pixel driver circuit is illustrated through the example in which the first initialization voltage Vref1 is a low-level signal. In the initialization stage, a signal Sn-1 on the first scan signal line is at a low level, and a signal Sn on the second scan signal line and a signal Emit on the light emission control signal line EM are at a high level; at this time, the fifth transistor T5 is turned on, the first transistor T1, the second transistor T2, the third transistor T3, the fourth transistor T4, the sixth transistor T6 and the seventh transistor T7 are turned off; the potential at the first reference voltage output terminal is applied to the first capacitor Cst via the fifth transistor T5, that is, the potential at a first node N1 is the first initialization voltage Vref1, and at this time, the potential at a control terminal of a drive transistor T3 is also the first initialization voltage Vref1. In the data write stage, the signal Sn on the second scan line is at a low level, and the signal Sn-1 on the first scan line and the signal Emit on the light emission control signal line EM are at a high level; the second transistor T2, the fourth transistor T4 and the seventh transistor T7 are turned on, at this time, a data signal Vdata is written into the second transistor T2 and the fourth transistor T4, the potential at the control terminal of the drive transistor T3 is the first initialization voltage Vref1 which is also at a low potential, the third transistor T3 is also turned on, the data signal Vdata on the data signal line DATA is written into the second transistor T2, the third transistor T3 and the fourth transistor T4 and is applied to the first node N1, and thus the potential at the first node N1 is gradually pulled high by the potential at the data signal line DATA. When the gate voltage of the third transistor T3 is pulled up to the extent where a voltage difference between the gate voltage of the third transistor T3 and the voltage of a source of the third transistor T3 is less than or equal to the threshold voltage of the third transistor T3, the drive transistor T3 is in a turned-off state. In the data write stage, the seventh transistor T7 is also turned on, and the seventh transistor M7 writes the second initialization voltage Vref2 on a second reference voltage line into a first electrode of the light-emitting module 106 to initializes the potential at the first electrode of the light-emitting module 106, so that the impact of the voltage of the first electrode of the light-emitting module 106 of the previous frame on the voltage of the first electrode of the light-emitting module 106 of the subsequent frame can be reduced, and the display evenness can be further improved. In the light emission stage, the signal Emit on the light emission control signal line EM is at a low level, the signal Sn-1 on the first scan signal line and the signal Sn on the second scan signal line are at a high level, at this time, the first transistor T1 and the sixth transistor T6 are turned on, a path is formed between the first power supply PVDD and the second power supply PVEE, the third transistor T3 outputs a light emission drive signal to the light-emitting module 106, and thus the light-emitting module 106 emits light. Further, at least one of the third transistor T3 in the drive module 101, the fourth transistor T4 in the threshold compensation module 104 and the fifth transistor T5 in the first initialization module 102 may adopt the first double-gate structure. Exemplarily, the example is illustrated in which the third transistor T3, the fourth transistor T4 and the fifth transistor T5 are all first double-gate structures. As shown in FIG. 6, the first bottom gate electrode 1001 of the third transistor T3, the first bottom gate electrode 1001 of the fourth transistor T4 and the first bottom gate electrode 1001 of the fifth transistor T5 are separately access to the same first modulation voltage V1, so that in the initialization stage, the fifth transistor T5 is normally turned on, and in the data write stage, the third transistor T3 and the fourth transistor T4 are normally turned on, thus the negative bias of the threshold voltage of the third transistor T3, the fourth transistor T4 and the fifth transistor T5 is reduced, and the normal display of the display panel is ensured.

Figure 10:
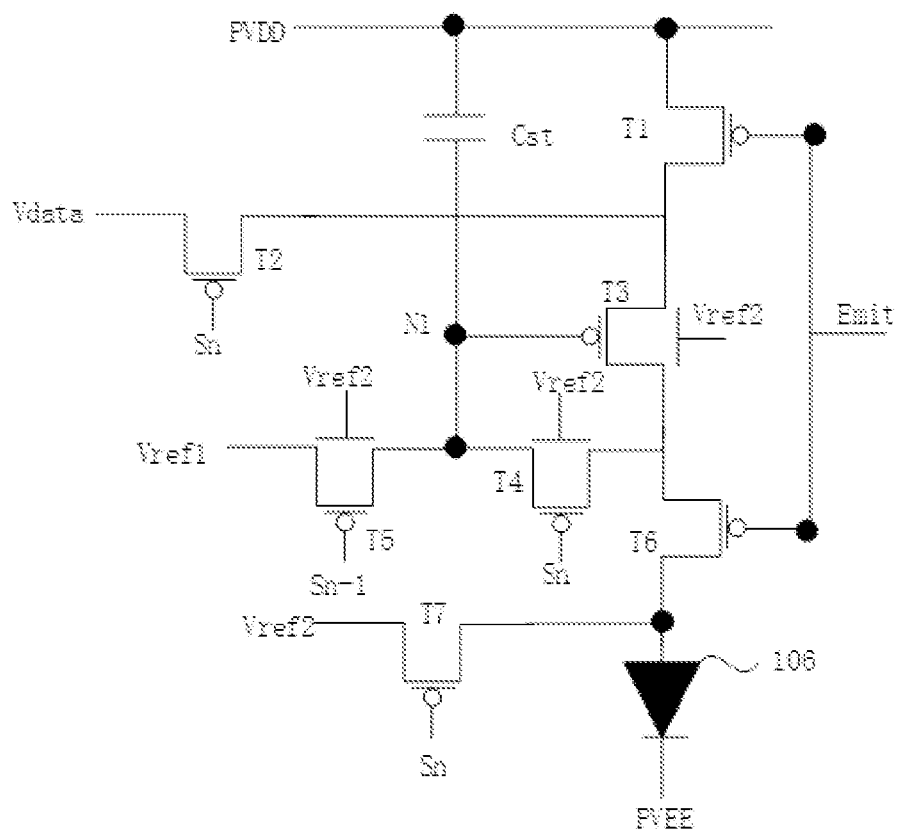
FIG. 10 is a structural diagram of another pixel driver circuit according to an embodiment of the present disclosure.

In an embodiment, FIG. 10 is a structural diagram of another pixel driver circuit according to an embodiment of the present disclosure. As shown in FIG. 6 and FIG. 10, the first initialization voltage Vref1 or the second initialization voltage Vref2 is also served as the first modulation voltage V1.

As shown in FIG. 6, the first bottom gate electrode 1001 of the third transistor T3, the first bottom gate electrode 1001 of the fourth transistor T4 or the first bottom gate electrode 1001 of the fifth transistor T5 may access to the first initialization voltage Vref1, or as shown in FIG. 10, the first bottom gate electrode 1001 of the third transistor T3, the first bottom gate electrode 1001 of the fourth transistor T4 or the first bottom gate electrode 1001 of the fifth transistor T5 may access to the second initialization voltage Vref2. The first initialization voltage Vref1 and the second initialization voltage Vref2 are generally at a low level, so that the threshold voltage of the third transistor T3, the threshold voltage of the fourth transistor T4 or the threshold voltage of the fifth transistor T5 is not negatively biased, the threshold voltage is positively biased, thus the difficulty of turning on the transistor is reduced, the power consumption of the pixel driver circuit is reduced, and the service life is improved. The first initialization voltage Vref1 or the second initialization voltage Vref2 in the pixel driver circuit is also served as the first modulation voltage, so that additional signal lines are avoided, the number of signal lines is reduced, and the process difficulty is reduced.

Figure 11:
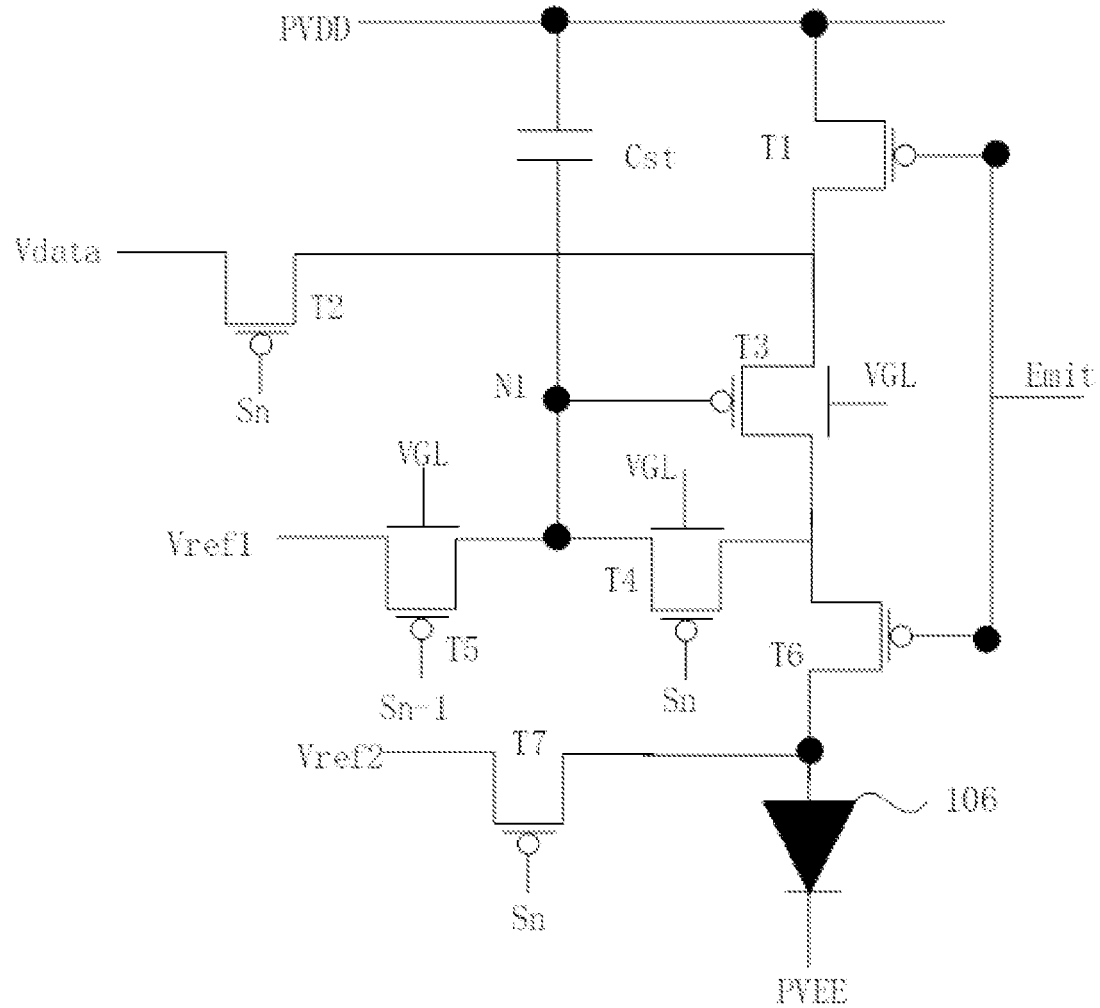
FIG. 11 is a structural diagram of another pixel driver circuit according to an embodiment of the present disclosure.

In an embodiment, FIG. 11 is a structural diagram of another pixel driver circuit according to an embodiment of the present disclosure. As shown in FIG. 11, the low voltage signal VGL of the gate driver circuit is also served as the first modulation voltage V1.

The display panel further includes the gate driver circuit. The gate driver circuit is connected to a gate line for outputting a gate drive signal to the gate line. The gate drive signal is used for driving the transistors, and the gate driver circuit includes multiple gate drive signals. The low voltage signal VGL in the gate driver circuit is also served as the first modulation voltage V1, so that the transistor with the first double-gate structure accessing to the low voltage signal VGL is normally turned on during the turning-on process, the negative bias of the threshold voltage is avoided, the power consumption of the pixel driver circuit is reduced, and thus the normal display of the display panel is ensured; in addition, additional signal lines are avoided, and thus the difficulty of the manufacturing process is reduced.

Figure 12:
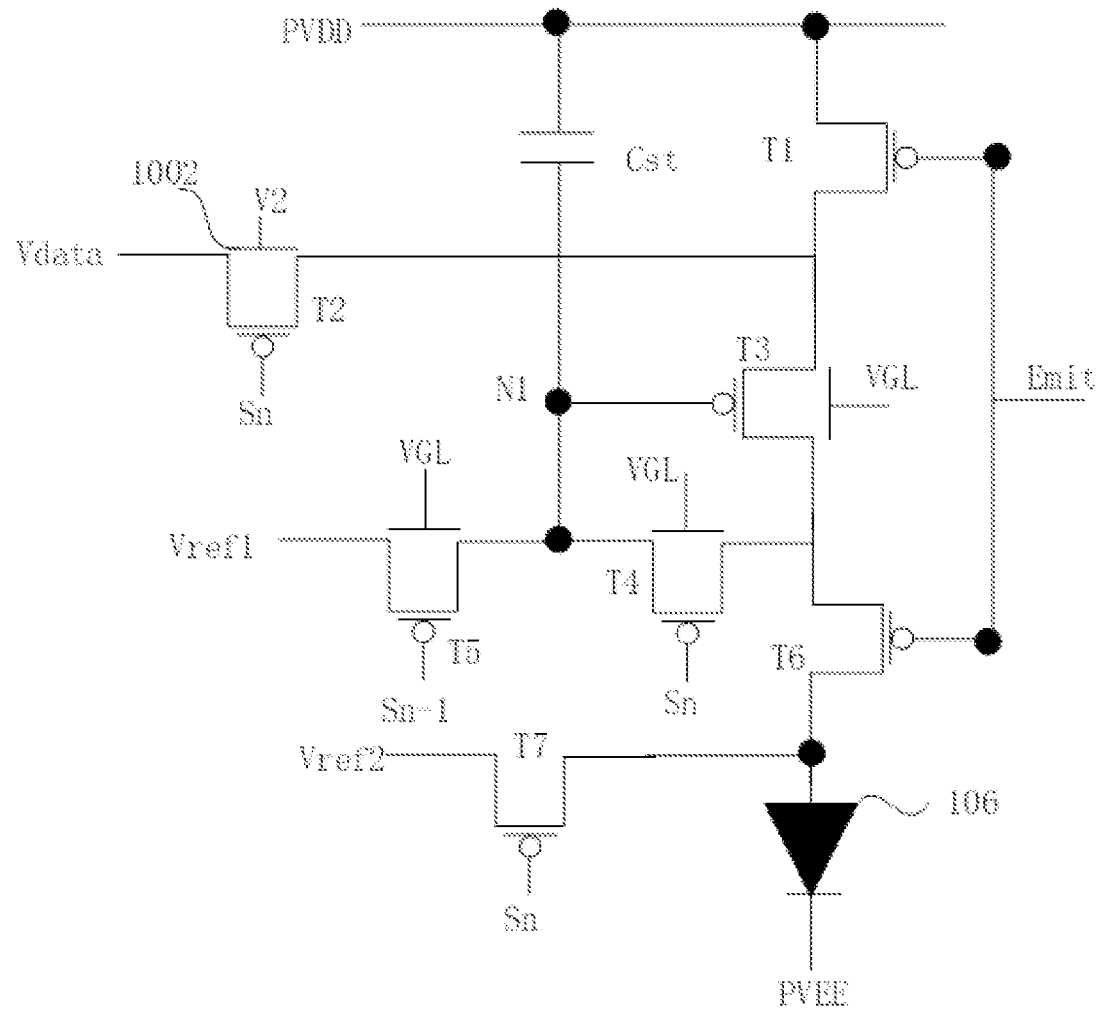
FIG. 12 is a structural diagram of another pixel driver circuit according to an embodiment of the present disclosure.

In an embodiment, FIG. 12 is a structural diagram of another pixel driver circuit according to an embodiment of the present disclosure. As shown in FIG. 12, the second transistor T2 adopts a second double-gate structure, where the second double-gate structure includes a control terminal and a second bottom gate electrode 1002, and the second bottom gate electrode 1002 is configured to access to a second modulation voltage V2, so that the threshold voltage of the second transistor T2 is in the negative bias state.

The data write module 105 includes the second transistor T2. The second transistor T2 is set as the second double-gate structure, the second bottom gate electrode 1002 of the second transistor T2 accesses to the second modulation voltage V2, and the second modulation voltage V2 may be a fixed voltage signal. Since the threshold voltage of the second transistor T2 tends to be positively biased under the impact of heat, light or electricity and thus results in a splitting-screen phenomenon, the second modulation voltage V2 may be accordingly set as a positive voltage signal in the embodiment, so that the threshold voltage of the second transistor T2 is in the negative bias state; in this manner, the abnormal turning-on of the second transistor T2 is avoided, the splitting-screen problem is improved, and the display effect of the display panel is ensured.

In an embodiment, the second modulation voltage V2 is greater than 3V.

For the second transistor T2 which is in the turned-off state for a long time, the second modulation voltage V2 serves to increase the threshold voltage deviation in the second transistor T2, so that the second transistor T2 is difficult to turn on; the second bottom gate electrode 1002 in the second transistor T2 with the second double-gate structure accesses to the second modulation voltage V2 which is greater than 3V, thus the negative bias occurs on the threshold voltage in the second transistor T2, so that the abnormal turning-on of the second transistor T2 is avoided, and the splitting-screen phenomenon is improved.

Figure 13:
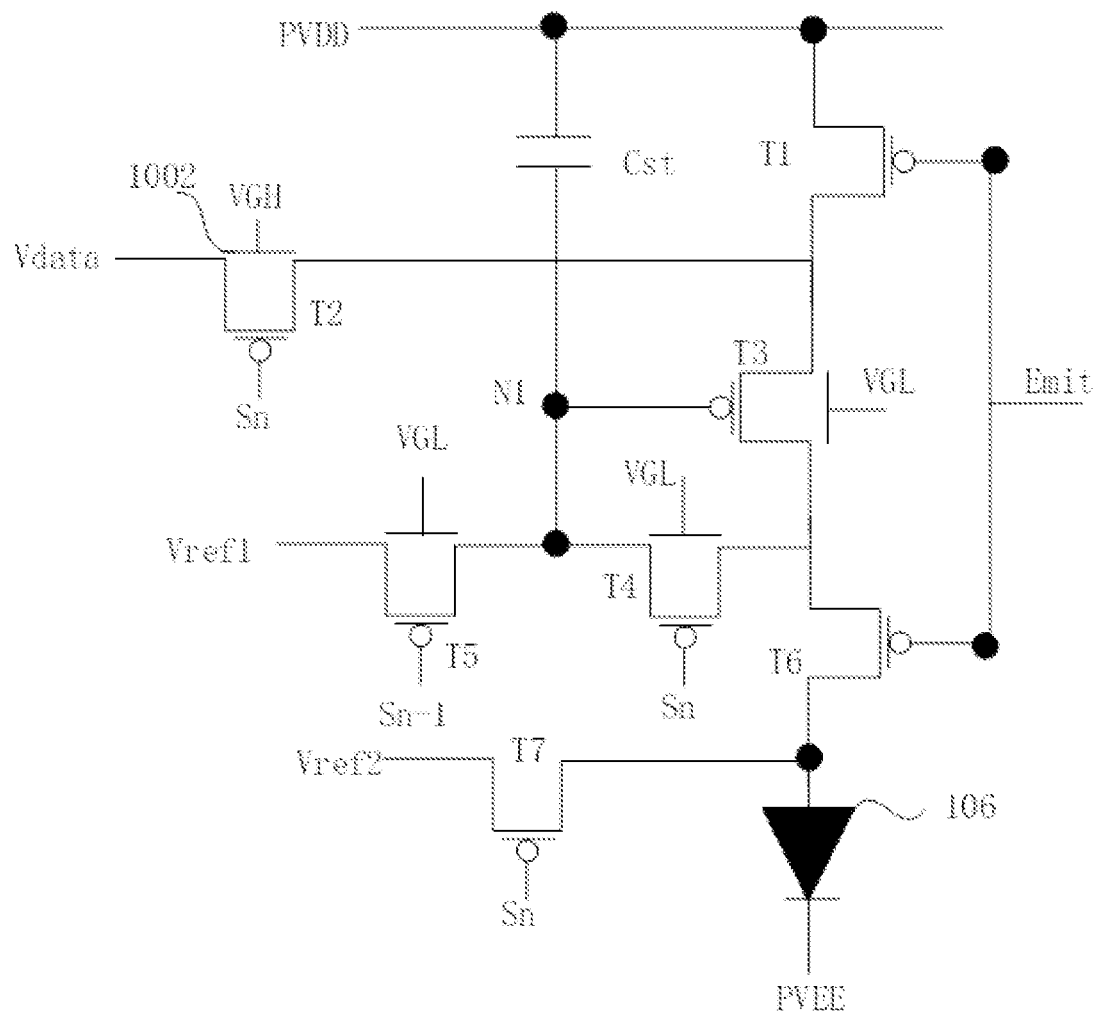
FIG. 13 is a structural diagram of another pixel driver circuit according to an embodiment of the present disclosure.

In an embodiment, FIG. 13 is a structural diagram of another pixel driver circuit according to an embodiment of the present disclosure. As shown in FIG. 13, the high voltage signal VGL of the gate driver circuit is also served as the second modulation voltage V2.

The gate driver circuit includes multiple gate drive voltage signals. To ensure the negative bias of the threshold voltage in the second transistor T2, the second bottom gate electrode 1002 of the second transistor T2 may access to the high voltage signal VGH in the gate driver circuit, and the high voltage signal VGH is also served as the second modulation voltage V2, so that the negative bias of the threshold voltage in the second transistor T2 is ensured, the splitting-screen phenomenon is improved, and the normal display of the display panel is ensured; in addition, additional signal lines are avoided, the number of signal lines is reduced, and the process difficulty is reduced. Moreover, the second modulation voltage V2 may also be a signal such as PVDD.

Figure 14:
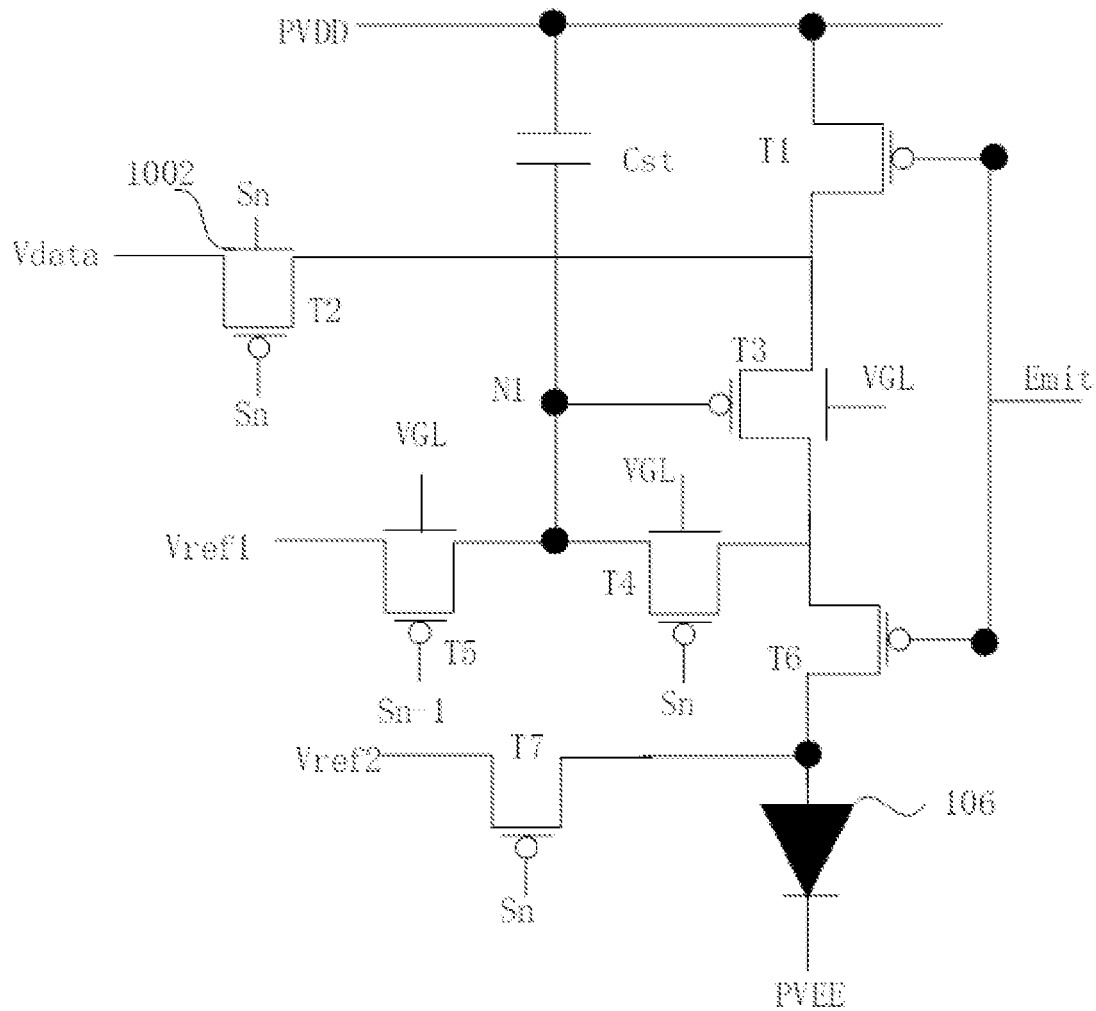
FIG. 14 is a structural diagram of another pixel driver circuit according to an embodiment of the present disclosure.

In an embodiment, FIG. 14 is a structural diagram of another pixel driver circuit according to an embodiment of the present disclosure. As shown in FIG. 14, the control terminal and the second bottom gate electrode 1002 of the second transistor T2 are both connected to the second scan signal line.

The signal Sn on the second scan signal line is generally at a high level. The second transistor T2 is in the turned-off state for a long time, that is, in the negative bias state of the threshold voltage, and thus is not easy to turn on to introduce the data signal Vdata. However, when the second transistor T2 is turned on, the threshold voltage of the second transistor T2 is not negatively biased at this moment, so that it is not difficult to turn on the second transistor T2, and the splitting-screen phenomenon is improved to ensure the display effect of the display panel.

Based on the same inventive concept, the embodiments of the present disclosure further provide a display panel. The display panel 200 includes the pixel driver circuit of any one of the preceding embodiments of the present disclosure. The display panel has the same or similar beneficial effects as the preceding pixel driver circuit, which is not repeated here.

Figure 15:
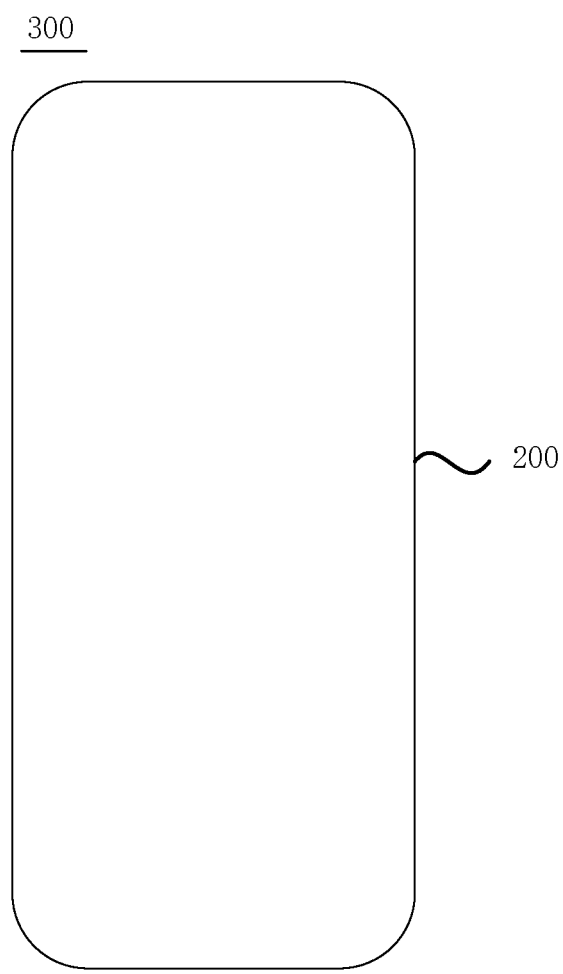
FIG. 15 is a structural diagram of a display device according to an embodiment of the present disclosure.

FIG. 15 is a structural diagram of a display device according to an embodiment of the present disclosure. As shown in FIG. 15, the display device 300 includes the display panel 200 of the preceding embodiments.

It is to be noted that the display device provided in the embodiment has the same or corresponding beneficial effects of the display panel of the preceding embodiments, which is not repeated here. The display device 300 provided in the embodiment of the present disclosure may be the phone shown in FIG. 15, or may be any electronic product having the display function, including but not limited to: televisions, laptops, desktop displays, tablets, digital cameras, smart bracelets, smart glasses, in-vehicle displays, medical devices, industrial control devices, touch interactive terminals, etc., which is not particularly limited in the embodiment of the present disclosure.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising a pixel driver circuit, wherein the pixel driver circuit comprises: a drive module, a first initialization module, a storage module, a threshold compensation module, a data write module and a light-emitting module, wherein a first terminal of the drive module is configured to receive a signal provided by a first power supply, a second terminal of the drive module is configured to provide a light emission drive signal for the light-emitting module, the storage module is connected between a control terminal of the drive module and the first terminal of the drive module, and the threshold compensation module is connected between the control terminal of the drive module and the second terminal of the drive module;

the data write module is connected to the first terminal of the drive module for transmitting a data voltage to the drive module, and the first initialization module is connected between a first reference voltage output terminal and the control terminal of the drive module and the first initialization module is configured for providing a first initialization voltage for the drive module; and at least one of a transistor of the drive module, a transistor of the first initialization module and a transistor of the threshold compensation module adopts a first double-gate structure, the transistor adopting the first double-gate structure comprises a control terminal and a first bottom gate electrode, and the first bottom gate electrode is configured to access to a first modulation voltage;

wherein the pixel driver circuit further comprises: a second initialization module, a first light emission control module and a second light emission control module;

wherein the second initialization module is connected between a second reference voltage output terminal and a first terminal of the light-emitting module and the second initialization module is configured for providing a second initialization voltage for the light-emitting module; and wherein the first light emission control module is connected between the first power supply and the first terminal of the drive module; and the second light emission control module is connected between the second terminal of the drive module and the first terminal of the light-emitting module, and a second terminal of the light-emitting module is connected to a second power supply;

wherein the storage module comprises a first capacitor, the first light emission control module comprises a first transistor, the data write module comprises a second transistor, the drive module comprises a third transistor, the threshold compensation module comprises a fourth transistor, the first initialization module comprises a fifth transistor, the second light emission control module comprises a sixth transistor, and the second initialization module comprises a seventh transistor, wherein a control terminal of the third transistor is separately connected to a second terminal of the fifth transistor and a first terminal of the fourth transistor, a first terminal of the third transistor is connected to a second terminal of the first transistor, a first terminal of the first transistor is connected to the first power supply, a second terminal of the third transistor is separately connected to a second terminal of the fourth transistor and a first terminal of the sixth transistor, and a second terminal of the sixth transistor is connected to the first terminal of the light-emitting module;

a first terminal of the fifth transistor is connected to the first reference voltage output terminal, a first terminal of the second transistor is connected to a data signal line, a second terminal of the second transistor is connected to the first terminal of the third transistor, a first terminal of the seventh transistor is connected to the second reference voltage output terminal, and a second terminal of the seventh transistor is connected to the first terminal of the light-emitting module;

at least one of the third transistor, the fourth transistor and the fifth transistor adopts the first double-gate structure, a control terminal of the first transistor and a control terminal of the sixth transistor are connected to a light emission control signal line, a control terminal of the fifth transistor is connected to a first scan signal line, a control terminal of the fourth transistor, a control terminal of the second transistor and a control terminal of the seventh transistor are connected to a second scan signal line; and wherein the second transistor adopts a second double-gate structure, wherein the second double-gate structure comprises a control terminal and a second bottom gate electrode, and the second bottom gate electrode is configured to access to a second modulation voltage, wherein a threshold voltage of the second transistor is in a negative bias state.

2. The display panel according to claim 1, wherein the transistor of the threshold compensation module adopts the first double-gate structure.

3. The display panel according to claim 1, wherein the transistor of the first initialization module adopts the first double-gate structure.

4. The display panel according to claim 1, wherein the first modulation voltage is less than or equal to 3V.

5. The display panel according to claim 4, wherein the first modulation voltage is less than or equal to 0V.

6. The display panel according to claim 5, wherein the first initialization voltage is also served as the first modulation voltage.

7. The display panel according to claim 1, wherein the first initialization voltage or the second initialization voltage is also served as the first modulation voltage.

8. The display panel according to claim 1, further comprising a gate driver circuit and a gate line, wherein the gate driver circuit is connected to the pixel driver circuit through the gate line.

9. The display panel according to claim 1, wherein the second modulation voltage is greater than 3V.

10. The display panel according to claim 9, wherein a high voltage signal of a gate driver circuit is also served as the second modulation voltage.

11. The display panel according to claim 1, wherein the control terminal of the second transistor and the second bottom gate electrode of the second transistor are both connected to the second scan signal line.

12. A display device, comprising a display panel, wherein the display panel comprises a pixel driver circuit, wherein the pixel driver circuit comprises a drive module, a first initialization module, a storage module, a threshold compensation module, a data write module and a light-emitting module, wherein a first terminal of the drive module is configured to receive a signal provided by a first power supply, a second terminal of the drive module is configured to provide a light emission drive signal for the light-emitting module, the storage module is connected between a control terminal of the drive module and the first terminal of the drive module, and the threshold compensation module is connected between the control terminal of the drive module and the second terminal of the drive module;

the data write module is connected to the first terminal of the drive module for transmitting a data voltage to the drive module, and the first initialization module is connected between a first reference voltage output terminal and the control terminal of the drive module and the first initialization module is configured for providing a first initialization voltage for the drive module; and at least one of a transistor of the drive module, a transistor of the first initialization module and a transistor of the threshold compensation module adopts a first double-gate structure, the transistor adopting the first double-gate structure comprises a control terminal and a first bottom gate electrode, and the first bottom gate electrode is configured to access to a first modulation voltage;

wherein the pixel driver circuit further comprises: a second initialization module, a first light emission control module and a second light emission control module;

wherein the second initialization module is connected between a second reference voltage output terminal and a first terminal of the light-emitting module and the second initialization module is configured for providing a second initialization voltage for the light-emitting module; and wherein the first light emission control module is connected between the first power supply and the first terminal of the drive module; and the second light emission control module is connected between the second terminal of the drive module and the first terminal of the light-emitting module, and a second terminal of the light-emitting module is connected to a second power supply;

wherein the storage module comprises a first capacitor, the first light emission control module comprises a first transistor, the data write module comprises a second transistor, the drive module comprises a third transistor, the threshold compensation module comprises a fourth transistor, the first initialization module comprises a fifth transistor, the second light emission control module comprises a sixth transistor, and the second initialization module comprises a seventh transistor, wherein a control terminal of the third transistor is separately connected to a second terminal of the fifth transistor and a first terminal of the fourth transistor, a first terminal of the third transistor is connected to a second terminal of the first transistor, a first terminal of the first transistor is connected to the first power supply, a second terminal of the third transistor is separately connected to a second terminal of the fourth transistor and a first terminal of the sixth transistor, and a second terminal of the sixth transistor is connected to the first terminal of the light-emitting module;

a first terminal of the fifth transistor is connected to the first reference voltage output terminal, a first terminal of the second transistor is connected to a data signal line, a second terminal of the second transistor is connected to the first terminal of the third transistor, a first terminal of the seventh transistor is connected to the second reference voltage output terminal, and a second terminal of the seventh transistor is connected to the first terminal of the light-emitting module;

at least one of the third transistor, the fourth transistor and the fifth transistor adopts the first double-gate structure, a control terminal of the first transistor and a control terminal of the sixth transistor are connected to a light emission control signal line, a control terminal of the fifth transistor is connected to a first scan signal line, a control terminal of the fourth transistor, a control terminal of the second transistor and a control terminal of the seventh transistor are connected to a second scan signal line; and wherein the second transistor adopts a second double-gate structure, wherein the second double-gate structure comprises a control terminal and a second bottom gate electrode, and the second bottom gate electrode is configured to access to a second modulation voltage, wherein a threshold voltage of the second transistor is in a negative bias state.

13. The display device according to claim 12, wherein the transistor of the threshold compensation module adopts the first double-gate structure.

14. The display device according to claim 12, wherein the transistor of the first initialization module adopts the first double-gate structure.

15. The display device according to claim 12, wherein the first modulation voltage is less than or equal to 3V.

16. The display device according to claim 15, wherein the first modulation voltage is less than or equal to 0V.

* * * * *